United States Patent
Yu et al.

(10) Patent No.: US 12,362,315 B2
(45) Date of Patent: Jul. 15, 2025

(54) HETEROGENEOUS DIELECTRIC BONDING SCHEME

(71) Applicant: Taiwan Semiconductor Manufacturing Co., Ltd., Hsinchu (TW)

(72) Inventors: Chen-Hua Yu, Hsinchu (TW); Wen-Chih Chiou, Zhunan Township (TW); Ku-Feng Yang, Baoshan Township (TW); Ming-Tsu Chung, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 18/521,610

(22) Filed: Nov. 28, 2023

(65) Prior Publication Data
US 2024/0096847 A1  Mar. 21, 2024

Related U.S. Application Data

(63) Continuation of application No. 17/457,704, filed on Dec. 6, 2021, now Pat. No. 11,869,869.
(Continued)

(51) Int. Cl.
*H01L 23/48* (2006.01)
*H01L 23/00* (2006.01)
(Continued)

(52) U.S. Cl.
CPC .............. *H01L 24/80* (2013.01); *H01L 24/08* (2013.01); *H01L 2224/08145* (2013.01); *H01L 2224/80895* (2013.01); *H01L 2224/80896* (2013.01)

(58) Field of Classification Search
CPC ..................... H01L 24/80; H01L 24/08; H01L 2224/08145; H01L 2224/80895;
(Continued)

(56) References Cited

U.S. PATENT DOCUMENTS 10,128,209 B2  11/2018  Liu et al.
10,483,243 B2  11/2019  Kim et al.
(Continued)

FOREIGN PATENT DOCUMENTS

CN  107017271 A  8/2017
CN  112542394 A  3/2021
(Continued)

*Primary Examiner* — Niki H Nguyen
(74) *Attorney, Agent, or Firm* — Slater Matsil, LLP

(57) ABSTRACT

A method includes putting a first package component into contact with a second package component. The first package component comprises a first dielectric layer including a first dielectric material, and the first dielectric material is a silicon-oxide-based dielectric material. The second package component includes a second dielectric layer including a second dielectric material different from the first dielectric material. The second dielectric material comprises silicon and an element selected from the group consisting of carbon, nitrogen, and combinations thereof. An annealing process is performed to bond the first dielectric layer to the second dielectric layer.

20 Claims, 15 Drawing Sheets

Related U.S. Application Data

(60) Provisional application No. 63/178,081, filed on Apr. 22, 2021.

(51) Int. Cl.
  *H01L 23/52* (2006.01)
  *H01L 29/40* (2006.01)

(58) Field of Classification Search
  CPC ....... H01L 2224/80896; H01L 25/0657; H01L 2224/32225; H01L 24/73; H01L 2224/16225; H01L 24/05; H01L 2224/32145; H01L 24/13; H01L 2224/16227; H01L 2224/0401; H01L 24/81; H01L 25/072; H01L 25/0655; H01L 2224/48137; H01L 2224/83801; H01L 24/09; H01L 2924/15331; H01L 2224/08146; H01L 33/48; H01L 2224/16237; H01L 2224/04026; H01L 21/76897; H01L 2224/16238; H01L 25/0756; H01L 25/071; H01L 2224/4846; H01L 2224/48463; H01L 2224/73203; H01L 2224/85205; H01L 2225/06555; H01L 24/10; H01L 24/12; H01L 24/28
  See application file for complete search history.

(56) References Cited

U.S. PATENT DOCUMENTS

| | | | |
|---|---|---|---|
| 10,522,449 B2 * | 12/2019 | Chen | .................. H01L 25/0657 |
| 11,145,538 B2 | 10/2021 | Libbert et al. | |
| 11,183,477 B2 | 11/2021 | Liff et al. | |
| 2006/0121690 A1 | 6/2006 | Pogge et al. | |
| 2016/0027764 A1 | 1/2016 | Kim et al. | |
| 2021/0091064 A1 * | 3/2021 | Chen | ...................... H01L 24/96 |
| 2021/0098411 A1 | 4/2021 | Liff et al. | |
| 2022/0216246 A1 | 7/2022 | Hashiguchi | |
| 2023/0113465 A1 * | 4/2023 | Kim | ................... H01L 25/0652 257/777 |

FOREIGN PATENT DOCUMENTS

| | | |
|---|---|---|
| JP | 2020191334 A | 11/2020 |
| KR | 20170062616 A | 6/2017 |
| TW | 201533868 A | 9/2015 |
| TW | 201834222 A | 9/2018 |
| TW | 202013596 A | 4/2020 |
| TW | 202114116 A | 4/2021 |
| WO | 2021021253 A1 | 2/2021 |

* cited by examiner

HETEROGENEOUS DIELECTRIC BONDING SCHEME

PRIORITY CLAIM AND CROSS-REFERENCE

This application is a continuation of U.S. patent application Ser. No. 17/457,704, filed on Dec. 6, 2021, and entitled "Heterogeneous Dielectric Bonding Scheme," now U.S. Pat. No. 11,869,869, issued Jan. 9, 2024, which claims the benefit of the following provisionally filed U.S. patent application: Application No. 63/178,081, filed on Apr. 22, 2021, and entitled "Heterogeneous Dielectric Bonding Scheme," which application is hereby incorporated herein by reference.

BACKGROUND

Fusion bonding and hybrid bonding are common bonding schemes for bonding two package components such as wafers and dies to each other. The bonding processes are preferably performed at low temperatures, while the bonding strength is high, and the bonding interface region is thin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
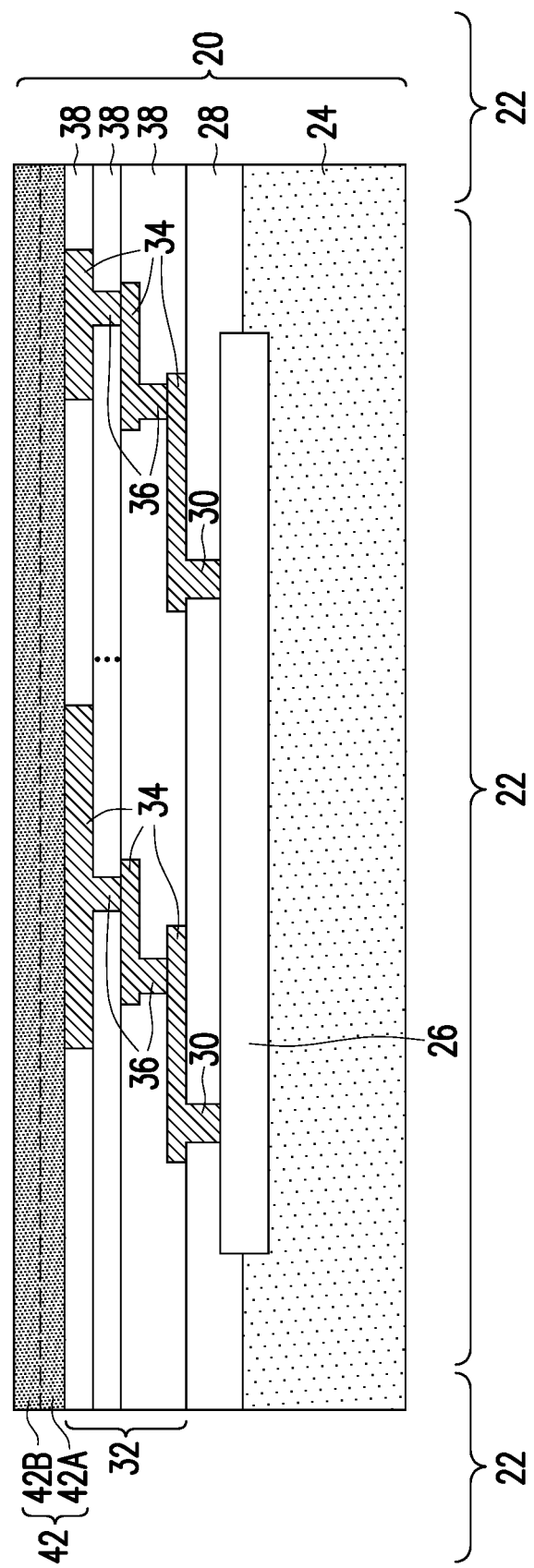
FIGS. 1-5 illustrate the cross-sectional views of intermediate stages in a fusion bonding process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A heterogeneous bonding structure and the method of forming the same are provided. In accordance with some embodiments of the present disclosure, a first package component includes a first surface dielectric layer, and a second package component includes a second surface dielectric layer. The first surface dielectric layer and the second surface dielectric layer comprise different silicon-containing dielectric materials. For example, the first surface dielectric layer is a silicon-oxide-based dielectric material (which may be free from carbon and nitrogen), and the second surface dielectric layer comprises silicon and another element(s) including nitrogen and/or carbon. The second surface dielectric layer may include silicon oxynitride (SiON), silicon nitride (SiN), silicon oxy-carbo-nitride (SiOCN), silicon carbon-nitride (SiCN), silicon oxy-carbide (SiOC), silicon carbide (SiC), or the like. The first surface dielectric layer is bonded to the second surface dielectric layer to form a heterogeneous bonding structure. With the formation of the heterogeneous bonding structure, the bonding strength is improved, and the yield of the bonding is increased. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 5 illustrate the cross-sectional views of intermediate stages in the formation of a package through fusion bonding in accordance with some embodiments of the present disclosure. The corresponding processes are also reflected schematically in the process flow shown in FIG. 19.

FIG. 1 illustrates a cross-sectional view of package component 20. In accordance with some embodiments of the present disclosure, package component 20 is or comprises a device wafer including active devices and possibly passive devices, which are represented as integrated circuit devices 26. Package component 20 may include a plurality of chips 22 therein, with one of chips 22 being illustrated. In accordance with alternative embodiments of the present disclosure, package component 20 is or comprises an interposer wafer, which is free from active devices, and may or may not include passive devices. In accordance with yet alternative embodiments of the present disclosure, package component 20 is or comprises a package substrate strip, which includes a core-less package substrate or a cored package substrate with a core therein. In accordance with yet alternative embodiments, package component 20 comprises a package such as an Integrated Fan-Out (InFO) Package. Package component 20, instead of being at wafer level, may also be at die level, and may be a device die, an interposer die, a package substrate, a discrete package (that has been sawed from a reconstructed wafer), or the like. In subsequent discussion, a device wafer is used as an example of package component 20, and package component 20 may also be referred to as wafer 20. The embodiments of the present disclosure may also be applied on interposer wafers, package substrates, reconstructed wafers, discrete packages, discrete device dies, discrete interposer dies, etc.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. In accordance with alternative embodiments, wafer 20 is used for forming interposers (which are free from active devices), and substrate 24 may be a semiconductor substrate or a dielectric substrate. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the conductive features on opposite sides of substrate 24.

In accordance with some embodiments of the present disclosure, wafer 20 includes integrated circuit devices 26, which are formed at the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, a low-k dielectric material, or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys therefore, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 may include metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers, each including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Interconnect structure 32 may also include a passivation layer, which may be formed of a non-low-k dielectric material over the low-k dielectric layer. The passivation layer may be formed of or comprises undoped silicate glass, silicon nitride, silicon oxide, or the like. There may also be metal pads (such as aluminum copper pads), Post Passivation Interconnect (PPI), metal pads, or the like, which are represented by conductive features.

Figure 19:
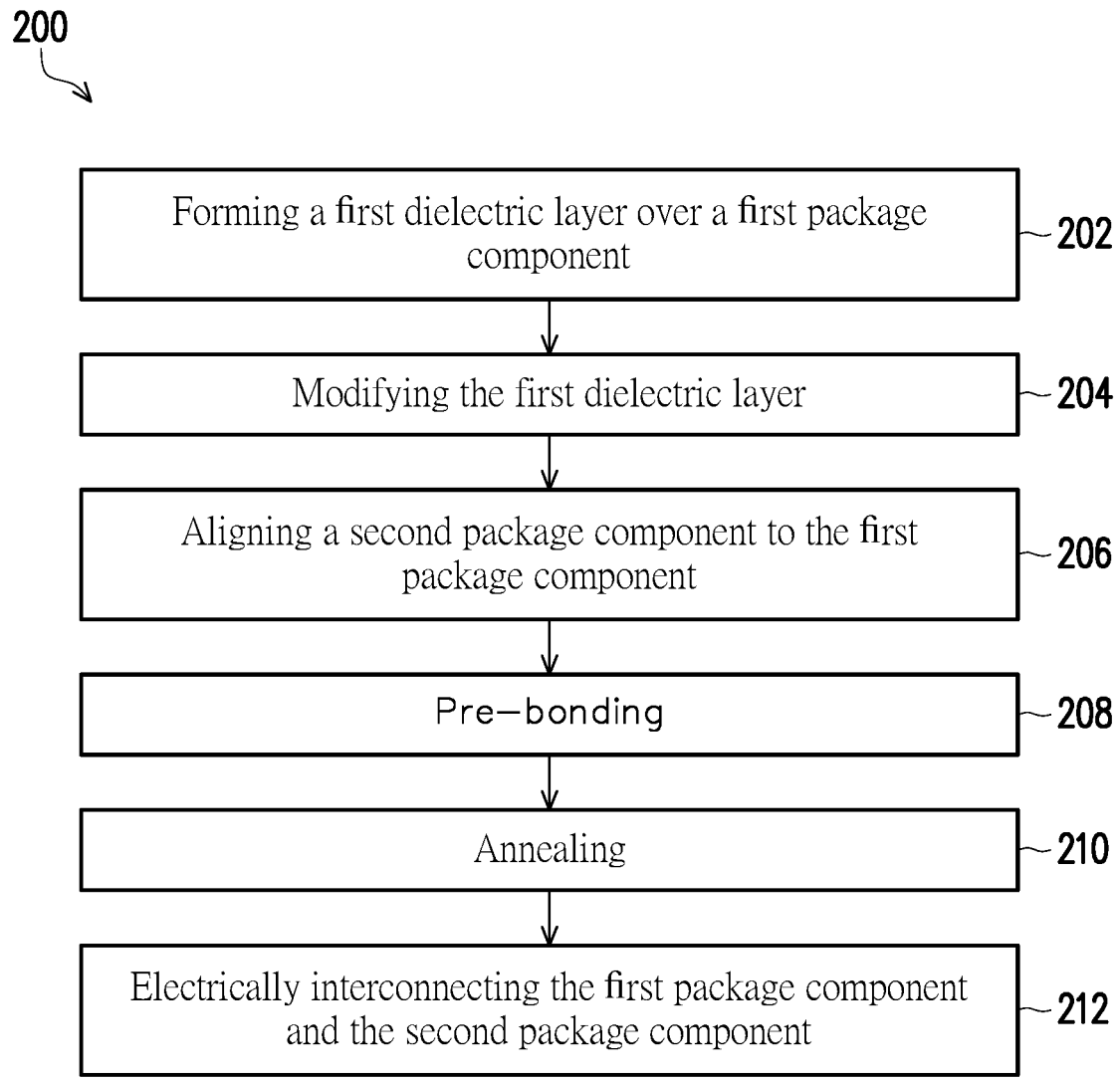
FIG. 19 illustrates a process flow of a bonding process in accordance with some embodiments.

Further referring to FIG. 1, dielectric layer 42 is deposited over interconnect structure 32. The respective process is illustrated as process 202 in the process flow 200 as shown in FIG. 19. The top surface of dielectric layer 42 is coplanar. Dielectric layer 42 may be a blanket dielectric layer that is free from conductive features (such as conductive lines and conductive pads) therein. In accordance with some embodiments, dielectric layer 42 is a homogeneous layer having a uniform composition from the top surface to the bottom surface of dielectric layer 42. Throughout the description, when two parts (such as two layers) are referred to as having the same composition, it means that the two parts have same types of elements, and the percentages of the corresponding elements in two parts are the same as each other. Conversely, when two parts are referred to as having different compositions, it means that one of the two parts either has at least one element not in the other part, or the two parts have the same elements, but the percentages of the elements in two parts are different from each other.

In accordance with some embodiments, dielectric layer 42 may be formed of or comprise a silicon-oxide-based dielectric material (which may be free or substantially free from carbon and nitrogen, for example, with the total atomic percentage of carbon and nitrogen being lower than about 5 percent). The silicon-oxide-based dielectric material may comprise silicon oxide ($SiO_2$), Fluoro Silicate glass (FSG), undoped silicate glass (USG), Phospho Silicate Glass (PSG), Boro Silicate glass (BSG), Boro Phospho Silicate Glass (BPSG), or the like. For example, silicon oxide may be formed by depositing a silicon layer, and then performing a thermal oxidation process. Alternatively, silicon oxide may be deposited, for example, using Tetraethyl orthosilicate (TEOS) as a precursor. In accordance with alternative embodiments, dielectric layer 42 may be formed of a silicon-base dielectric material that comprises one or both of carbon and nitrogen. The corresponding dielectric layer 42 is also referred to as a carbon-or-nitrogen containing dielectric material. Dielectric layer 42 may be expressed as $SiO_xN_yC_z$, with x being in the range between about 0 and about 2, y being in the range between about 0 and about 1.4, and z being in the range between about 0 and about 1, and x, y, and z will not be all equal to zero. For example, dielectric layer 42 may be formed of or comprises SiON, SiN, SiOCN, SiCN, SiOC, SiC, or the like. Dielectric layer 42 may also be undoped or doped with group III elements such as B, Ga, In, or the like, or group IV elements such as p, As, Sb, or the like.

In accordance with alternative embodiments, dielectric layer 42 is a composite layer comprising two or more sub layers therein. For example, in the illustrated example, dielectric layer 42 comprises dielectric (sub) layer 42A and dielectric (sub) layer 42B over dielectric (sub) layer 42A. These embodiments may be adopted when dielectric layer 42A and dielectric layer 142 (FIG. 3) in package component 120 are formed of a same dielectric material or substantially same dielectric material, and hence if dielectric layer 42A is bonded to dielectric layer 142 directly, a homogeneous bonding structure will be formed. Dielectric layer 42B is formed in accordance with these embodiments so that the dielectric layer 42B may be different from the corresponding dielectric layer 142 to form a heterogeneous structure. A dashed line is drawn between dielectric layers 42A and 42B to indicate that dielectric layer 42 may be a homogeneous layer, or may include sub layers therein.

Dielectric layers 42A and 42B comprise different materials, which means that at least one or both of the dielectric layers 42A and 42B comprises an element (O, C, and N) that is not in the other one of the dielectric layers 42A and 42B. For example, one of the dielectric layers 42A and 42B may be formed of a material selected from the above-discussed candidate silicon oxide-based material (such as $SiO_2$, FSG, USG, BSG, PSG, BPSG, or the like), and the other one of the dielectric layers 42A and 42B may be formed of a material selected from the candidate carbon-or-nitrogen containing dielectric materials (which may comprise carbon and/or nitrogen) such as SiON, SiN, SiOCN, SiCN, SiOC, SiC, or the like. The carbon-or-nitrogen containing dielectric material may also be expressed as $SiO_xN_yC_z$, with x being in the range between about 0 and about 2, y being in the range between about 0 and about 1.4, and z being in the range between about 0 and about 1. In accordance with alternative embodiments, dielectric layers 42A and 42B may comprise same elements, but have different atomic percentages of the elements. For example, both of dielectric layers 42A and 42B may comprise SiON, with a first layer in dielectric layers 42A and 42B having a first oxygen atomic percentage greater than a second oxygen atomic percentage in a second layer in dielectric layers 42A and 42B, and/or the first layer having a first nitrogen atomic percentage lower than a second nitrogen atomic percentage in the second layer.

Figure 2:
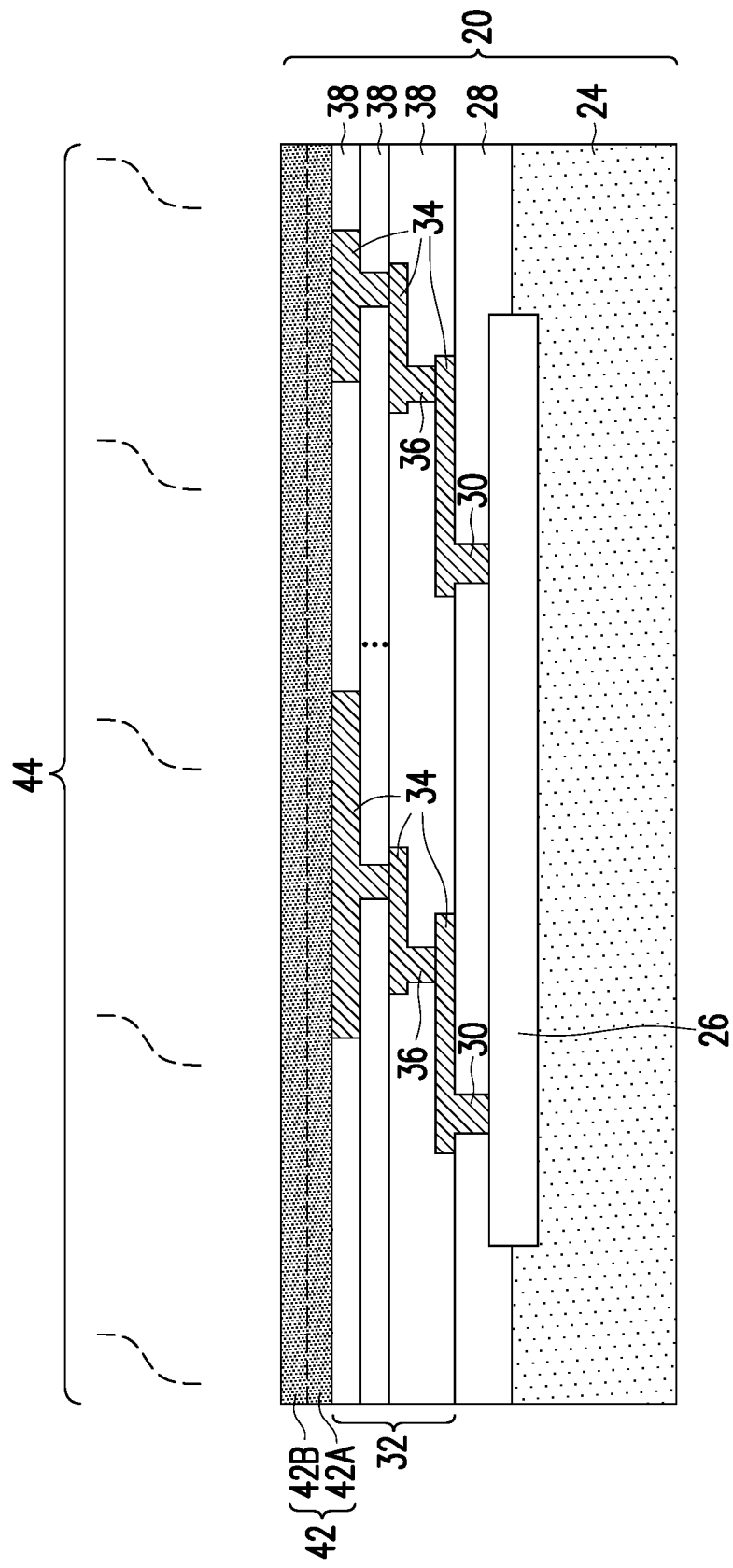

As will be discussed subsequently, due to the high bonding strength in accordance with some embodiments of the present disclosure, surface treatment (such as using the plasma of nitrogen (N 2) and/or oxygen (O 2)) may not be performed on dielectric layer 42. In accordance with alternative embodiments, package components 20 and package component 120 (FIG. 3) have already been formed, and dielectric layers 42 and 142 are formed of a same dielectric material. Accordingly, as shown in FIG. 2, a surface treatment process 44 may also be performed to modify the composition of one of dielectric layers 42 and 142. An example modification process is shown in FIG. 2. The respective process is illustrated as process 204 in the process flow 200 as shown in FIG. 19. The surface treatment process 44 is illustrated using dashed lines to indicate that it may or may not be performed. The surface treatment process 44 may be used for modifying the atomic percentage of nitrogen and/or oxygen in dielectric layer 42, so that the composition of dielectric layer 42 may have a greater difference than the composition of dielectric layer 142 (FIG. 3) in order to form a more heterogeneous structure. For example, when dielectric layer 42 has an higher (or equal) nitrogen atomic percentage (and possibly a lower oxygen atomic percentage) than dielectric layer 142 (FIG. 3), a plasma treatment and/or a thermal treatment may be performed on dielectric layer 42 using $N_2$ (but not $O_2$) to add nitrogen and to enlarge the difference between the nitrogen atomic percentages in dielectric layers 42 and 142. In accordance with alternative embodiments in which dielectric layer 42 has a higher (or equal) oxygen atomic percentage than dielectric layer 142 (FIG. 3), the treatment may be performed on dielectric layer 42 using $O_2$ (but not $N_2$) to add oxygen and to enlarge the difference between the oxygen atomic percentages in dielectric layers 42 and 142. In accordance with some embodiments, through the treatment process 44, the oxygen or nitrogen atomic percentage in dielectric layer 42 is increased, for example, by more than about 10 percent.

Figure 3:
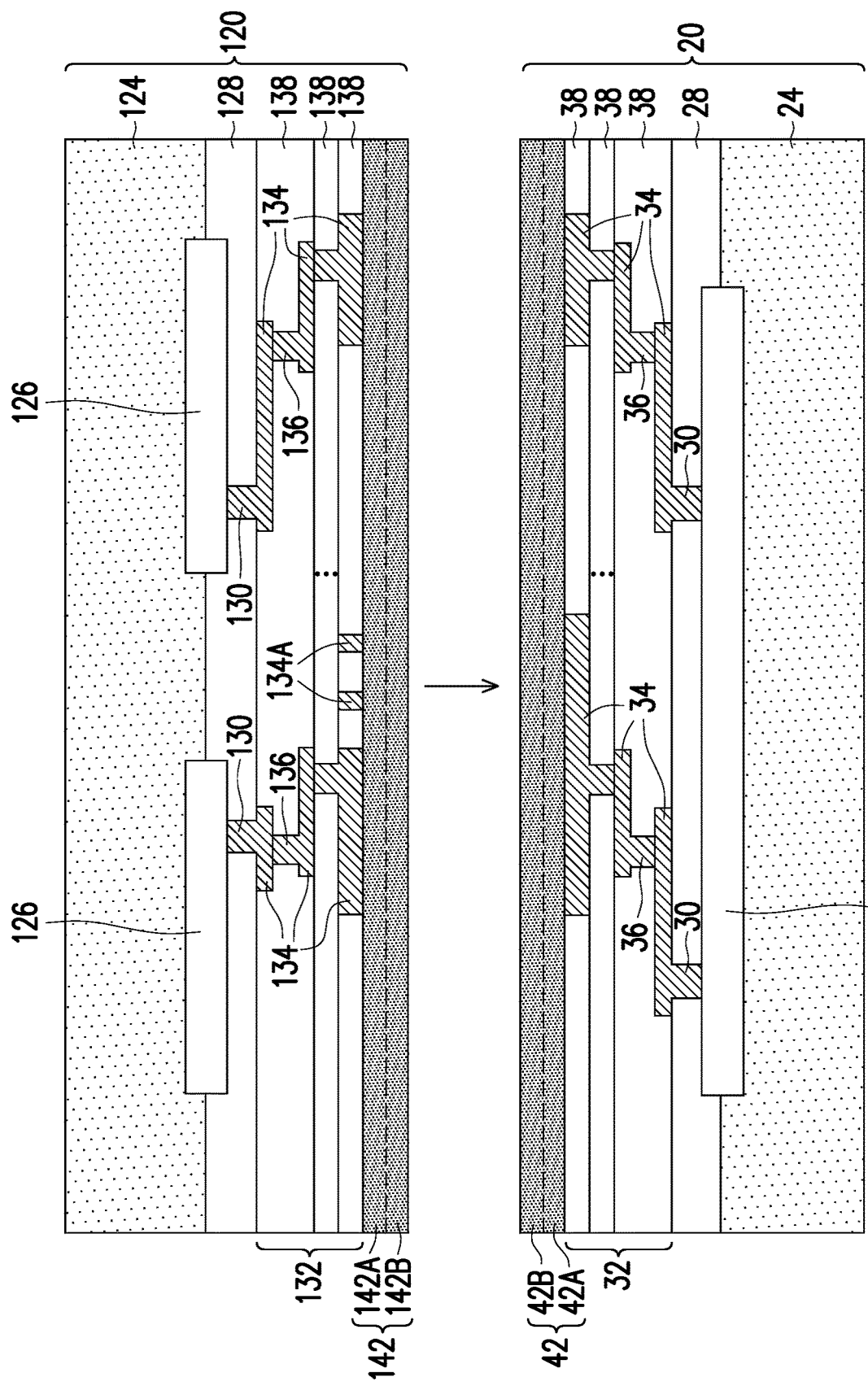

Referring to FIG. 3, package component 120 is formed, and is aligned to package component 20. The respective process is illustrated as process 206 in the process flow 200 as shown in FIG. 19. In accordance with some embodiments, package component 120 is a device wafer, an interposer wafer, a package substrate strip, a package, or the like. Package component 120 may be a same type of package component as package component 20, or may be a different type of package component than package component 20. For example, when package component 20 is a device wafer, package component 120 may be an interposer wafer or a package. In accordance with alternative embodiments, package component 120, instead of being a wafer-level package component, may be a die-level package component such as a device die, an interposer, a package substrate, a discrete package (that has been sawed from a reconstructed wafer), or the like. In subsequent discussion, a device wafer is used as an example package component 120, and package component 120 may also be referred to as device wafer 120. The embodiments of the present disclosure may also be applied on interposer wafers, package substrates, packages, etc.

The materials of the features in package component 120 may be found referring to the like features in package component 20, with the like features in package component 120 being denoted by adding number "1" in front of the reference numbers of the corresponding features in package component 20. For example, the substrate in package component 20 is denoted as 24, and accordingly, the substrate in package component 120 is denoted as 124. Package component 120 may include integrated circuit devices 126, ILD 128, contact plugs 130, Interconnect structure 132, dielectric layers 138, metal lines 134, and vias 136. The details of these features may be similar to the corresponding features in package component 20, and are not repeated herein.

Package component 120 further includes dielectric layer 142 at surface. Dielectric layer 142 may be a single layer formed of a homogeneous dielectric material, or may be a composite layer including a plurality of dielectric layers (such as 142A and 142B) formed of different dielectric materials with different compositions. The material of dielectric layer 142 may be selected from the same candidate materials for forming dielectric layer 42 (such as dielectric layers 42A and 42B). Also, the materials of dielectric layers 142A and 142B are different from each other, and their formation, structure and properties may be found referring to the discussion of the corresponding dielectric layers 42A and 42B, and are not repeated herein.

The material of dielectric layer 142 (or 142B if dielectric layer 142 is a composite layer) is different from the material of dielectric layer 42 (or 42B if dielectric layer 42 is a composite layer). If the original dielectric material of dielectric layers 42 and 142 are the same as each other, a dielectric material different from the materials of dielectric layers 42 and 142 may be formed on the top surface of one of dielectric layers 42 and 142, so that the materials that are to be bonded are different from each other.

In accordance with some embodiments, no nitrogen treatment process is performed on dielectric layer 142, and no oxygen treatment process is performed on dielectric layer 142. Alternatively, a plasma or thermal treatment process (similar to treatment process 44 in FIG. 2) may be performed using $N_2$ or $O_2$ to modify the material (by modifying its composition) of dielectric layer 142, so that the bonded materials of dielectric layers 42 and 142 are more different from each other. In accordance with some embodiments, one, but not both, of dielectric layers 42 and 142 is treated to modify its composition. In accordance with alternative embodiments, a first one of dielectric layers 42 and 142 is treated using $N_2$, and a second one of dielectric layers 42 and 142 is treated with $O_2$, so that the difference in their compositions is increased.

At the time of bonding, dielectric layers 42 and 142 comprise different materials, which means that at least one of (or both) the dielectric layers 42 and 142 comprises an element (O, C, or N) that is not in the other one of the dielectric layers 42 and 142. In accordance with some embodiments, dielectric layer 42 has a first oxygen atomic percentage, the dielectric layer 142 has a second oxygen atomic percentage, and a difference between the first oxygen atomic percentage and the second oxygen atomic percentage is greater than about 10 percent or 20 percent. For example, one of the dielectric layers 42 and 142 may be formed of a material selected from the above-discussed candidate silicon oxide-based material (such as $SiO_2$, FSG, USG, BSG, PSG, BPSG, or the like), and the other one of the dielectric layers 42 and 142 may be formed of a material selected from the candidate carbon-or-nitrogen containing dielectric material such as SiON, SiN, SiOCN, SiCN, SiOC, SiC, or the like. The material of dielectric layer 142 may also be expressed as $SiO_xN_yC_z$, with x being in the range between about 0 and about 2, y being in the range between about 0 and about 1.4, and z being in the range between about 0 and about 1. In accordance with alternative embodiments, dielectric layers 42 and 142 may comprise same elements, but have different atomic percentages of the elements. For example, both of dielectric layers 42 and 142 may comprise SiON, with a first layer in dielectric layers 42 and 142 having a first oxygen atomic percentage greater than a second oxygen atomic percentage in a second layer in dielectric layers 42 and 142, and/or the first layer having a first nitrogen atomic percentage lower than a second nitrogen atomic percentage in the second layer.

Figure 4:
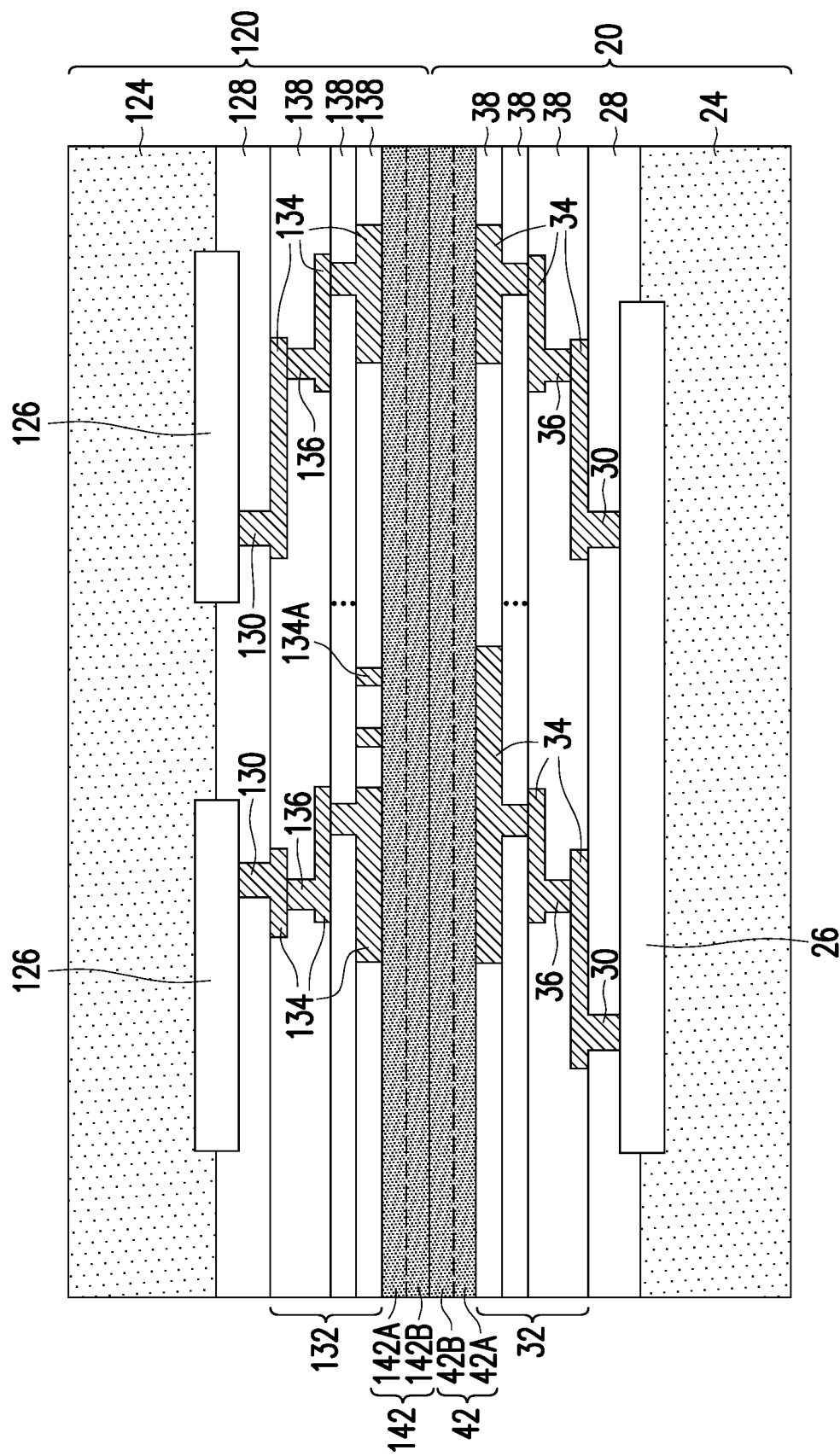

FIG. 4 illustrates a pre-bonding process and an annealing process following the pre-bonding process. The respective process is illustrated as processes 208 and 210 in the process flow 200 as shown in FIG. 19. In accordance with some embodiments, during the pre-bonding, package component 120 is put into contact with package component 20, with a pressing force applied to press package components 20 and 120 against each other. The pressing force may be lower than about 5 Newton per die in accordance with some example embodiments, while a greater or smaller force may also be used. The pre-bonding may be performed at room temperature (between about 20° C. and about 25° C.), and a higher temperature may also be used.

The pre-bonding may start from putting the center of package component 120 to the center of package component 20. The contacting propagates from the centers to the edges of package components 20 and 120, which propagation generates a bond wave from the centers to the edges. With the bond wave propagating from the centers to the edges, the air between package components 20 and 120 may be squeezed out, so that no air bubble is trapped between package components 20 and 120. The air bubble, if trapped, will cause the corresponding parts of package components 20 and 120 unable to bond to each other, and will result in yield loss. The time interval for the bond wave to travel from the centers to the edges (until full engagement of package component 120 to package component 20 is achieved) is referred to as engaging time interval hereinafter. The engaging time interval is desirable to be in certain range that is not too long and not too short. If the engaging time interval is too long, manufacturing throughput is reduced. If the engaging time interval is too short, air bubble may be trapped. The engaging time interval is also related to the size of wafers. In accordance with some embodiments, the engaging time interval for bonding two 300 mm wafers may be in a range between about 0.1 seconds and about 2 seconds.

The engaging time interval may be related to the materials of dielectric layers 42 and 142. The materials of dielectric layers 42 and 142 are accordingly adjusted to adjust the engaging time interval. For example, when the dielectric layers 42 and 142 are both formed of silicon oxide, the engaging time interval may be short. When the dielectric layers 42 and 142 are both formed of silicon nitride, the engaging time interval may be long. With the compositions of dielectric layers 42 and 142 being adjusted between that of silicon oxide and silicon nitride, the engaging time interval may also be adjusted, and may be changed to a desirable value. Also, as will be discussed in subsequent paragraphs, when heterogeneous bond is formed between dielectric layers 42 and 142, the bonding strength may be increased greater than that of the homogeneous bonding. Accordingly, to achieve greater bonding strength, and to improve bonding yield, the materials of dielectric layers 42 and 142 are different from each other, and are adjusted to have desirable compositions.

Since dielectric layers 42 and 142 may be exposed to air before pre-bonding, the surface layer of each dielectric layers 42 and 142 may be oxidized and have native oxide, which may have a thickness smaller than about 20 Å, and may be smaller than about 10 Å. The native oxide layers have increased oxygen atomic percentage than the underlying un-oxidized portions.

Figure 5:
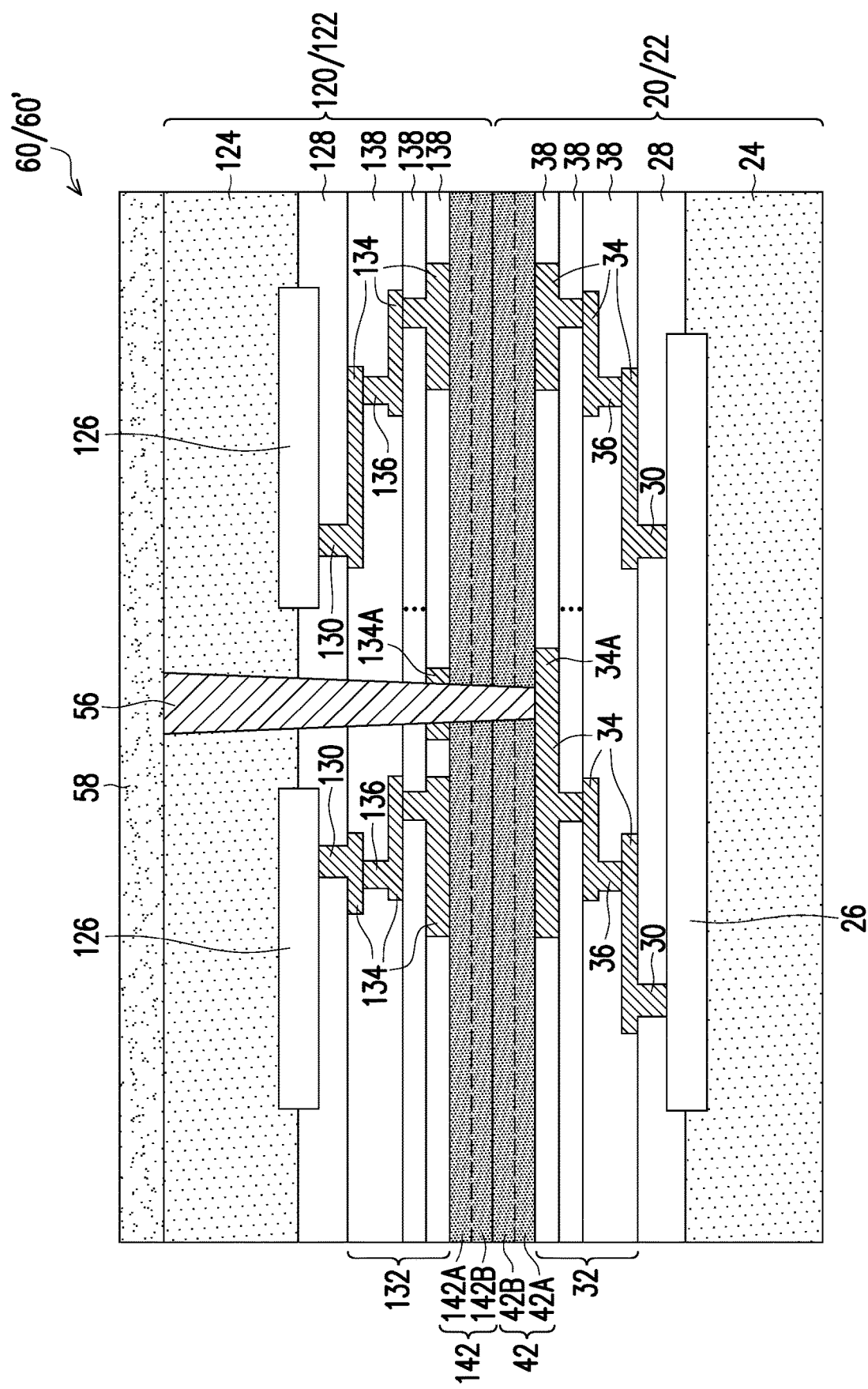

After the pre-bonding, an annealing process is performed, for example, with Si—O—Si bonds being formed between bond dielectric layers 42 and 142, so that dielectric layers 42 and 142 are bonded to each other with high bonding strength. The respective process is illustrated as process 210 in the process flow 200 as shown in FIG. 19. Composite wafer 60 is thus formed, as shown in FIG. 5. In accordance with some embodiments, the annealing process is performed at a temperature lower than 250° C., and may be lower than about 200° C. For example, the annealing may be performed at a temperature in the range between about 150° C. and about 200° C. This annealing temperature is lower than the required annealing temperature of 250° C. or higher for forming homogeneous bonding structures as in conventional bonding processes. The annealing duration may be in the range between about 5 minutes and about 30 minutes in accordance with some embodiments.

FIG. 5 further illustrates an example embodiment in which contact plug 56 is formed to penetrate through package component 120, and electrically connects metal pad 134A in package component 120 to metal pad 34A in package component 20. The respective process is illustrated as process 212 in the process flow 200 as shown in FIG. 19. Contact plug 56 lands on metal pad 34A of package component 20. Contact plug 56 also penetrates through, and may be in contact with dielectric layers 42 and 142. Dielectric layer 58 may be formed to cover contact plug 56 and substrate 124. A singulation process may then be performed to saw composite wafer 60 to form packages 60'. Each of the packages 60' may include a package component 22 (such as a device die) bonded to package component 122 (such as a device die).

FIGS. 6 through 10 illustrate some embodiments in which a hybrid bonding scheme is used to bond package component 20 to package component 120. These embodiments are similar to the embodiments in FIGS. 1-5, except that hybrid bonding, rather than fusion bonding, is used. Unless specified otherwise, the materials and the formation processes of the components in these embodiments are essentially the same as the like components, which are denoted by like reference numerals in the preceding embodiments shown in FIGS. 1 through 5. The details regarding the formation processes and the materials of the components shown in FIGS. 6 through 10 may thus be found in the discussion of the preceding embodiments.

Figure 6:
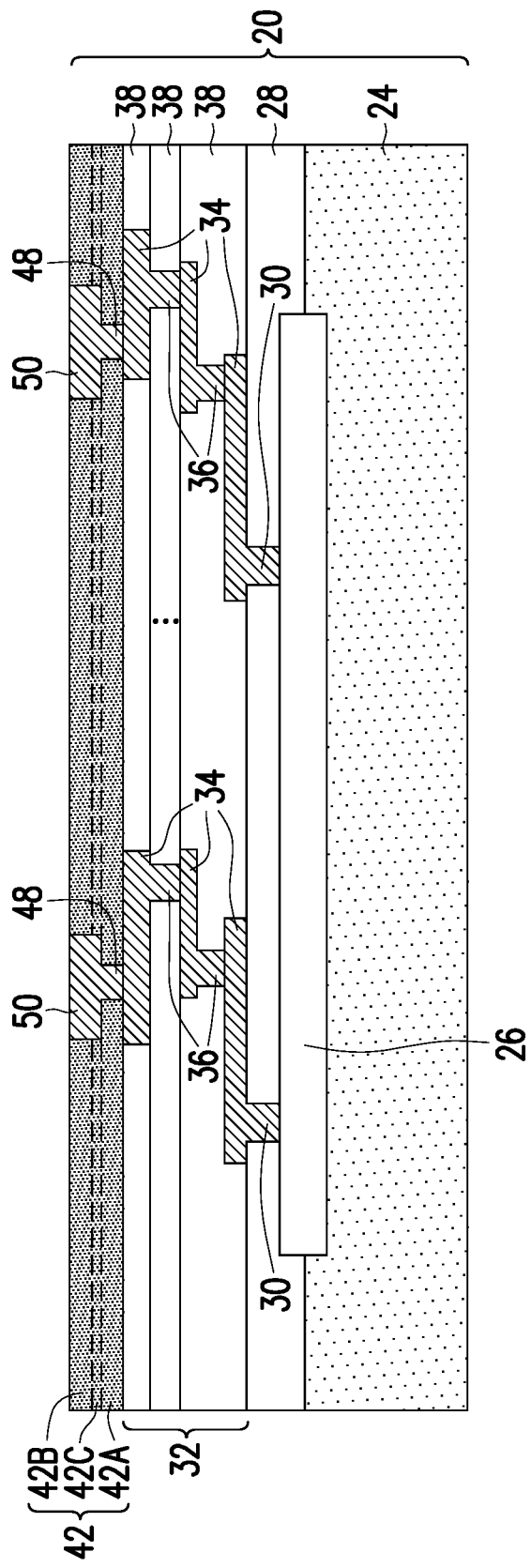
FIGS. 6-10 illustrate the cross-sectional views of intermediate stages in a hybrid bonding process in accordance with some embodiments.

Referring to FIG. 6, package component 20 is formed, with dielectric layer 42 formed at the surface of package component 20. Metal pads 50 are formed at the surface of dielectric layer 42. Vias 48 may be formed underlying metal pads 50, and electrically connect metal pads 50 to the underlying metal lines 34. In accordance with some embodiments, metal pads 50 and vias 48 are formed through a dual damascene process, which may include etching dielectric layer 42 to form via openings and overlying trenches, filling the via openings and the trenches with a diffusion barrier layer and a metallic material, and performing a planarization process, so that metal pads 50 and vias 48 are formed. The top surfaces of metal pads 50 are coplanar with the top surface of dielectric layer 42. The diffusion barrier layer may be formed of Ti, TiN, Ta, TaN, or the like. The metallic material may be formed of or comprise copper, a copper alloy, nickel, tungsten, or the like.

In accordance with some embodiments, dielectric layer 42 includes a single layer formed of a homogeneous material. In accordance with alternative embodiments, dielectric layer 42 is a composite layer comprises two or more layers formed of different materials. The materials of the single-layer or multi-layer dielectric layer 42 have been discussed in the preceding embodiments. Furthermore, in accordance with some embodiments, an etch stop layer 42C, which is formed of a material different from the material of dielectric layer 42B, may be formed to separate dielectric layers 42A from dielectric layer 42B.

Figure 7:
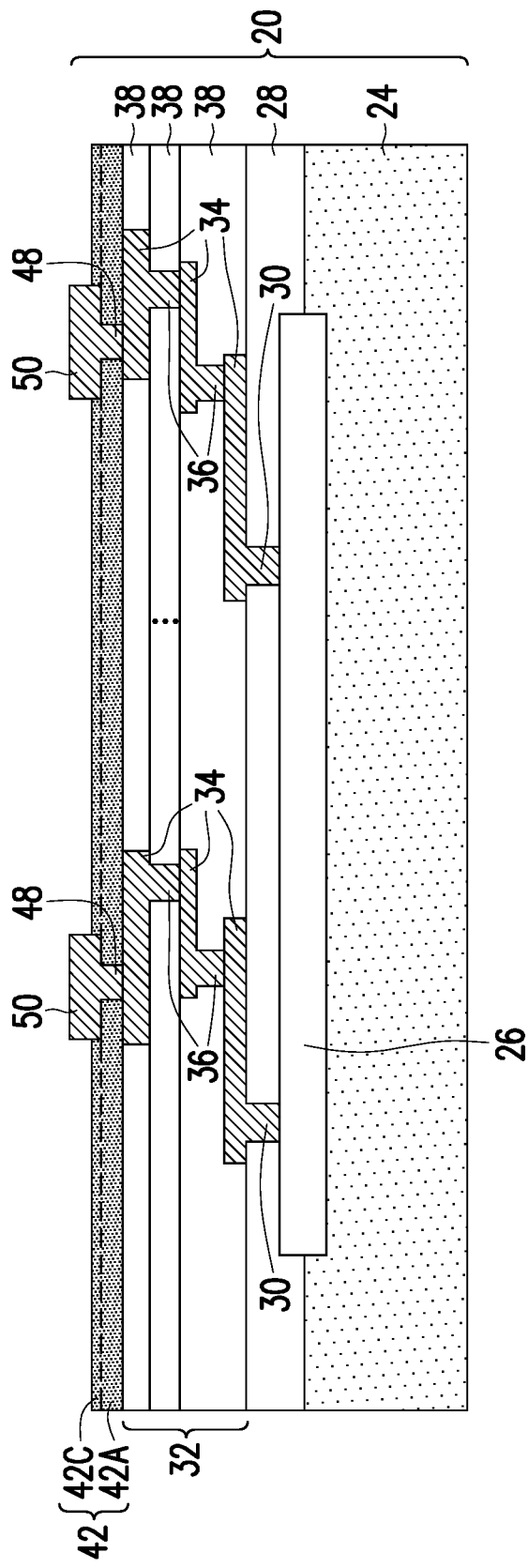
Figure 8:
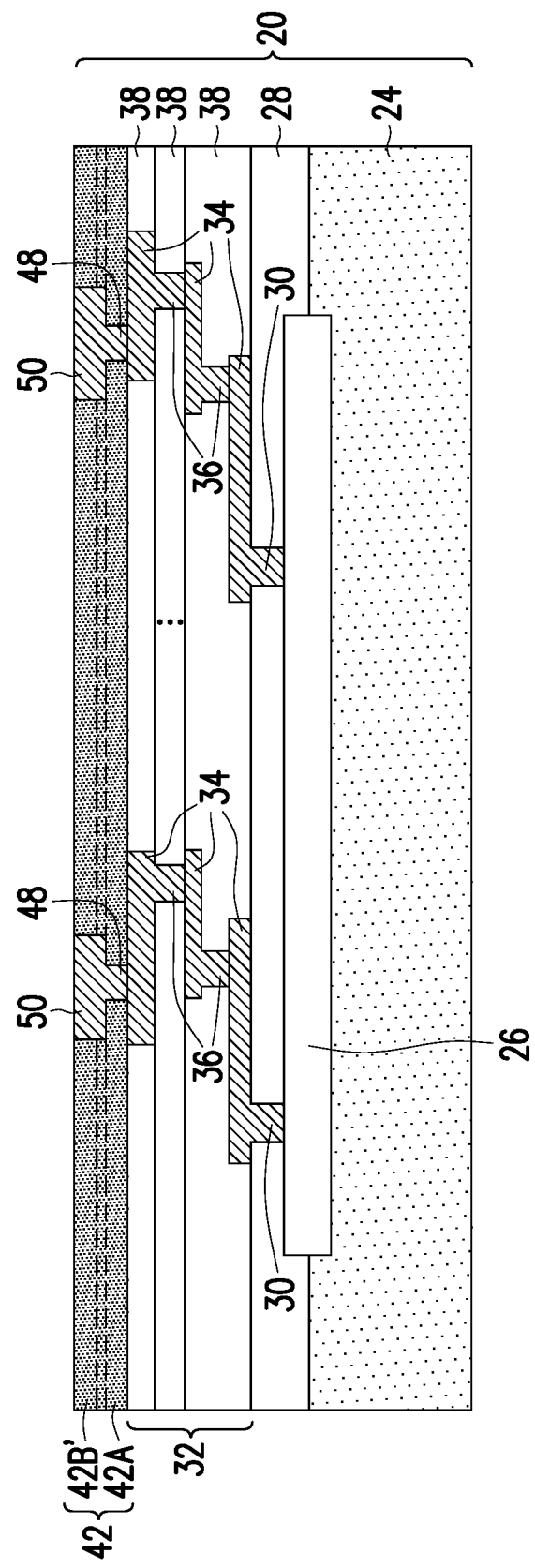
Figure 9:
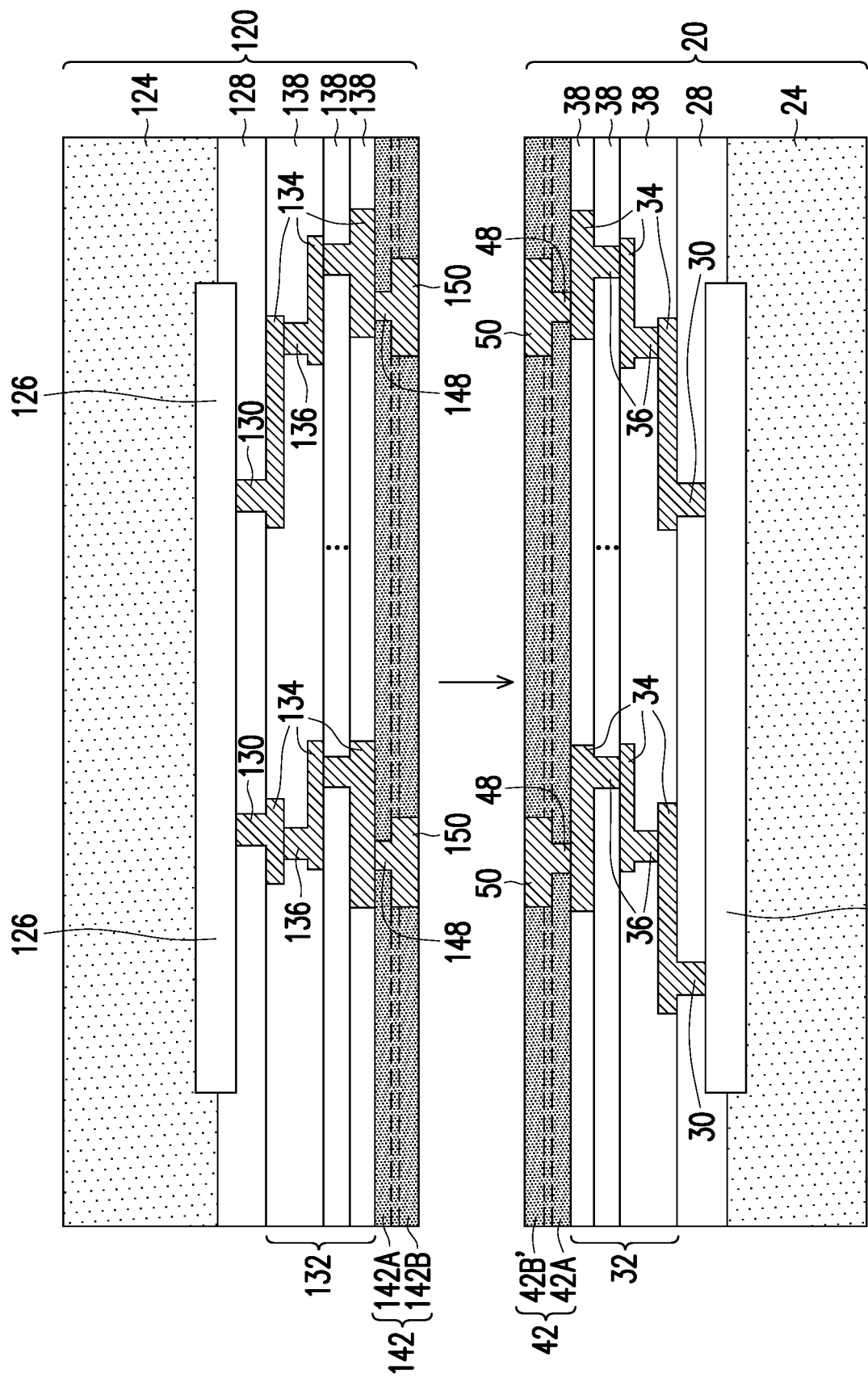

In accordance with some embodiments, the surface material of dielectric layer 42 is different from the surface material of dielectric layer 142 (FIG. 9). Accordingly, heterogeneous bonding process may be performed. The processes shown in FIGS. 7 and 8 are skipped, and the process as shown in FIG. 9 is performed. In accordance with alternative embodiments, either the surface material of dielectric layer 42 is the same as the surface material of dielectric layer 142 (FIG. 9), or the surface material of dielectric layer 42 is different from the surface material of dielectric layer 142 (FIG. 9), but the difference in their compositions is not significant enough to warrant a low annealing temperature while still achieving a high bonding strength and high yield. Accordingly, the surface material of dielectric layer 42 may be replaced with another dielectric material so it distinguishes from the material of dielectric layer 142 in order to achieve more heterogeneous bonding. An example embodiment is shown in FIGS. 7 and 8.

Referring to FIG. 7, a top portion of dielectric layer 42 is removed through etching. For example, layer 42B as shown in FIG. 6 may be removed. In accordance with some embodiments in which etch stop layer 42C is formed, the etching may be stopped on etch stop layer 42C. In accordance with alternative embodiments in which no etch stop layer is formed, the etching is performed using time mode, and the top surface of the remaining dielectric layer 42 may be at any position that is level with or higher than the top ends of vias 48.

FIG. 8 illustrates the formation of dielectric layer 42B'. In accordance with some embodiments, the formation process includes depositing a dielectric layer to a level higher than the top surfaces of bond pads 50, and performing a planarization process such as a CMP process or a mechanical grinding process, until the top surface of the resulting dielectric layer 42B' is coplanar with the top surfaces of bond pads 50. The material of dielectric layer 42B' is different from the surface material of dielectric layer 142 (FIG. 9), and also different from the material of the removed dielectric layer 42B (FIG. 6). In accordance with some embodiments in which etch stop layer 42C is formed, dielectric layer 42B' is over and contacting etch stop layer 42C. In accordance with alternative embodiments in which no etch stop layer is formed, dielectric layer 42B' is over and contacting the remaining dielectric layer 42 (referring to 42A), and the interface between dielectric layer 42B' and dielectric layer 42A may be at any position that is level with or higher than the top ends of vias 48.

FIG. 9 illustrates the alignment of package component 120 to package component 20, wherein bond pads 150 are aligned to the corresponding bond pads 50. A pre-bonding process is then performed, for example, by contacting a center portion of package component 120 to the center portion of package component 20, and allowing the propagation of the engagement, until the entire package component 120 is in contact with the entire package component 20. The candidate surface materials of dielectric layer 42 and dielectric layer 142 may be selected according to what have been discussed in the embodiments shown in FIGS. 1 through 5, and are not repeated herein. With the desirable difference between the surface materials of dielectric layers 42 and 142, an optimum engaging time interval may be achieved, so that no bubble is trapped between dielectric layers 42 and 142, while the throughput of the pre-bonding is still high.

Figure 10:
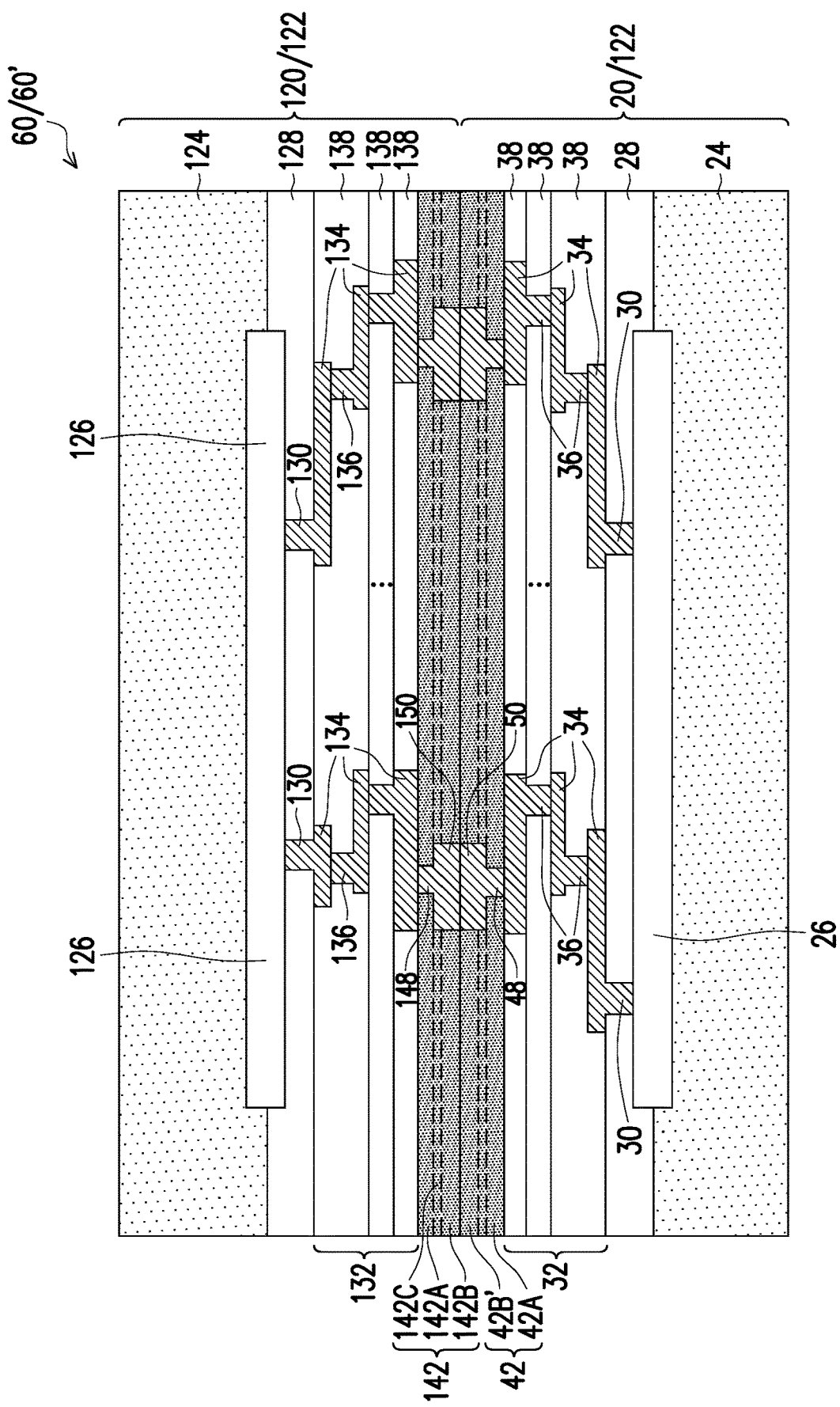

After the pre-bonding, an annealing process is performed to form composite wafer 60, as shown in FIG. 10. For example, Si—O—Si bonds between bond dielectric layers 42 and 142, so that dielectric 42 and 142 are bonded to each other with high bonding strength. During the annealing process, bond pads 50 and 150 also have their metal (such as copper) inter-diffused to each other, so that metal-to-metal direct bonding is achieved to join bond pads 50 to the corresponding bond pads 150. In accordance with some embodiments, the annealing process is performed at a temperature lower than 250° C., and may be lower than about 200° C. The annealing may be performed at a temperature in the range between about 125° C. and about 200° C. The annealing duration may be in the range between about 30 minutes and about 180 minutes. Again, with the heterogeneous bonding, the bonding strength is improved. A singulation process may then be performed to saw composite wafer 60 to form packages 60'. Each of the packages 60' may include a package component 22 (such as a device die) bonded to package component 122 (such as a device die).

In accordance with some embodiments, experiments are performed to find the optimum materials and optimum compositions of dielectric layers 42 and 142 that can achieve high bonding strength, proper engaging time interval, and low annealing temperature. For example, when dielectric layer 42 has the composition of $SiO_xN_yC_z$, a corresponding composition of $SiO_{x'}N_{y'}C_{z'}$ may be found for dielectric layer 142, to achieve optimum engaging time interval, high bonding strength that can be achieved using low annealing temperature. Since values x, y, and z have many combinations, the optimum values x', y', and z' also have many corresponding combinations corresponding to values x, y, and z. The dielectric layers 42 and 142 are thus formed with the optimum materials $SiO_xN_yC_z$ and $SiO_{x'}N_{y'}C_{z'}$.

Figure 11:
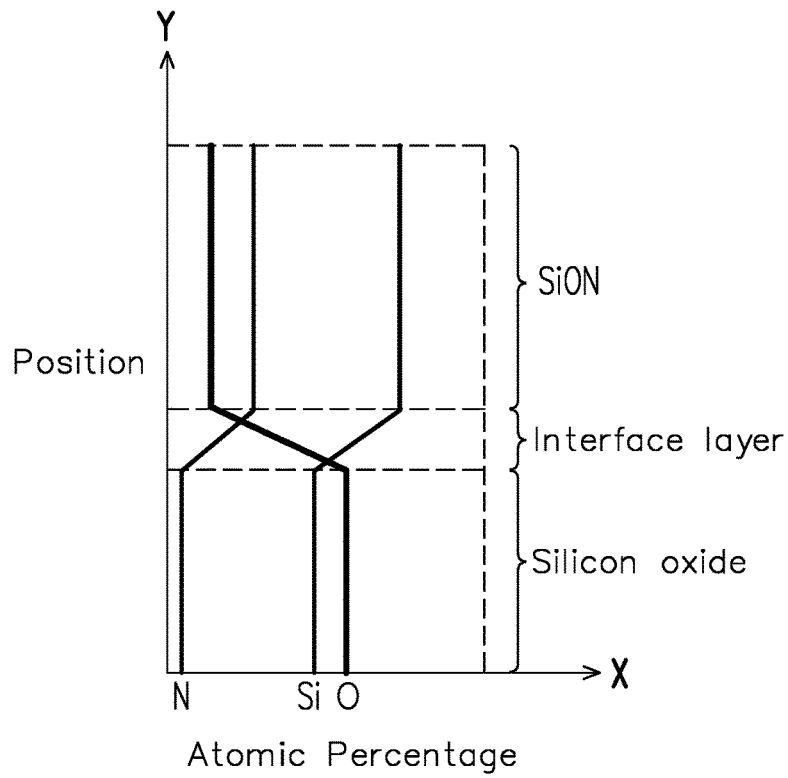
FIGS. 11 and 12 illustrate the distribution of some elements in some bonded structures in accordance with some embodiments.

FIG. 11 illustrates the Energy Dispersive X-Ray Analysis (EDX) line scan results of a sample wafer, with a SiON layer being bonded to a silicon oxide layer. The X-axis represents the atomic percentages, and the Y-axis represents the position in the bonded structure. The atomic percentages of Si, O, and N are shown. The SiON layer is on top of the silicon oxide layer, with an interface layer formed in between. The positions of the SiON layer, the silicon oxide layer, and the interface layer may be found by determining the changing of the atomic percentages of Si, O, and N. The EDX line scan results revealed that the thickness of the interface layer is advantageously smaller than about 65 Å, which is smaller than the preferred thickness of 80 Å, and is also significantly smaller than the thickness range of the interface layer formed using conventional homogeneous bonding scheme, which is about 100 Å to about 200 Å.

Figure 12:
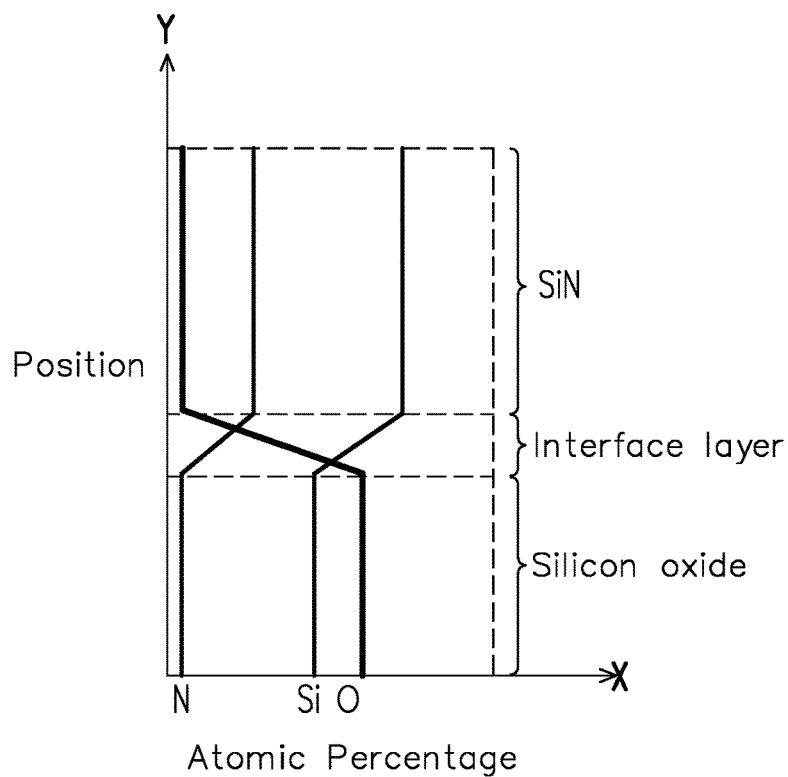

FIG. 12 illustrates the EDX line scan results of a sample wafer, with a SiN layer being bonded to a silicon oxide layer. The X-axis represents the atomic percentages, and the Y-axis represents the position in the bonded structure. The atomic percentages of Si, O, and N are shown. The SiN layer is on top of the silicon oxide layer, with an interface layer formed in between. The positions of the SiN layer, the silicon oxide layer, and the interface layer may be found by determining the changing of the atomic percentages of Si, O, and N. The EDX line scan results revealed that the thickness of the interface layer is smaller than about 350 Å. This result in combination with the results in FIG. 11 reveals that the thickness of the interface layer is significantly affected by the materials of dielectric layers 42 and 142, and the thickness of the interface layer may be reduced by selecting proper combinations of materials for dielectric layers 42 and 142.

Figure 13:
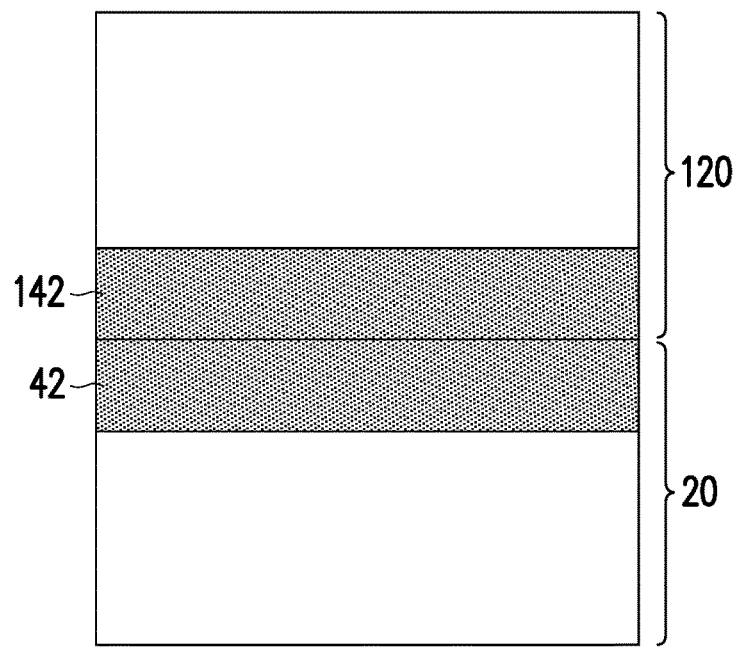
FIGS. 13 through 18 illustrate some bonded structures with different combinations of package components in accordance with some embodiments.
Figure 14:
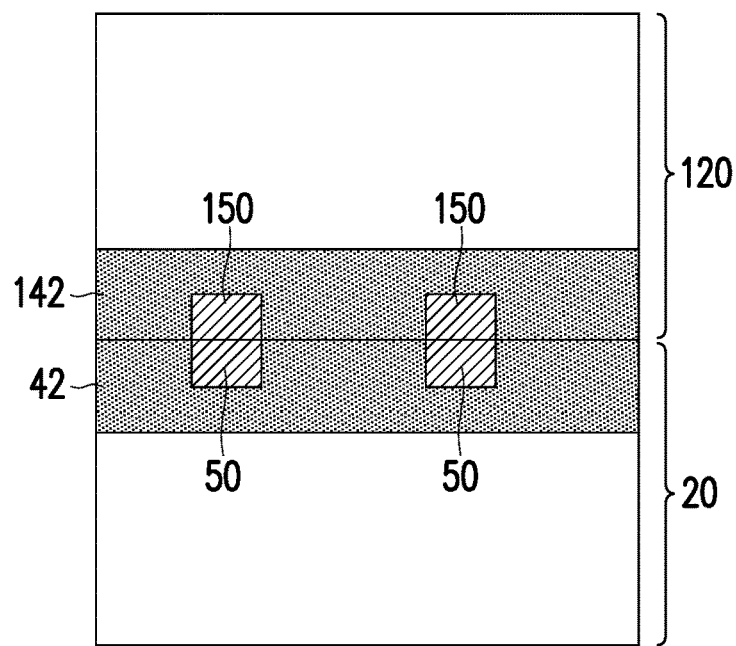
Figure 15:
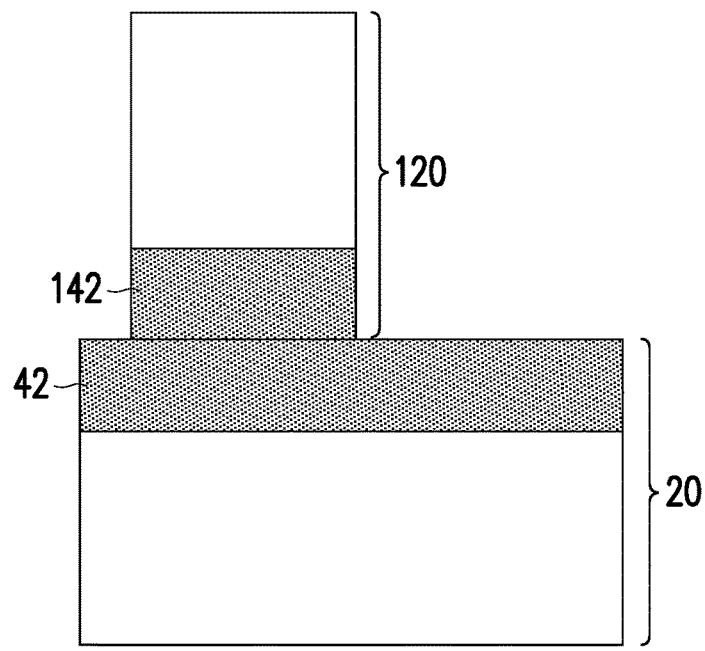
Figure 16:
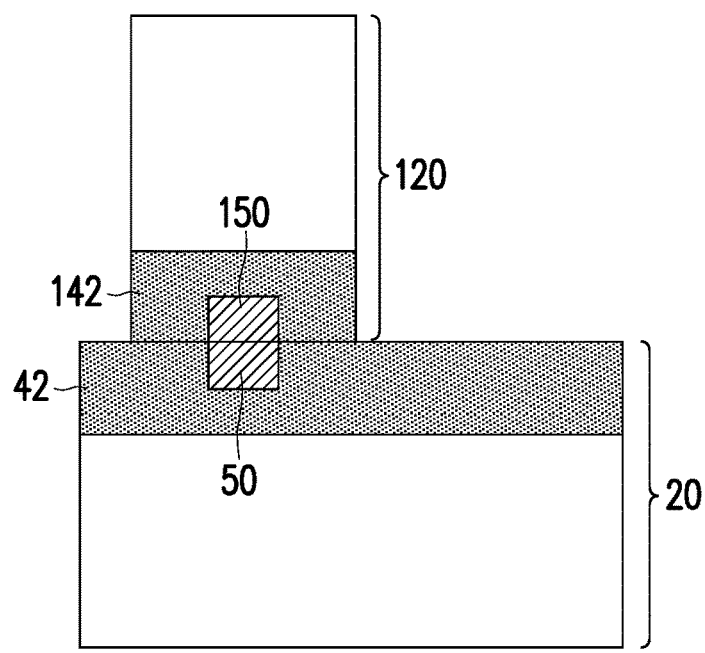
Figure 17:
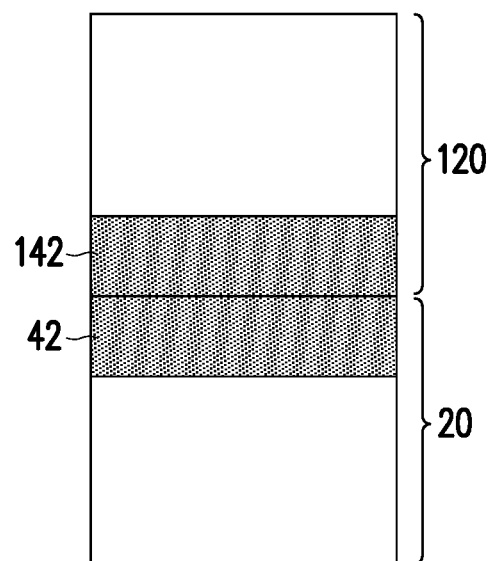
Figure 18:
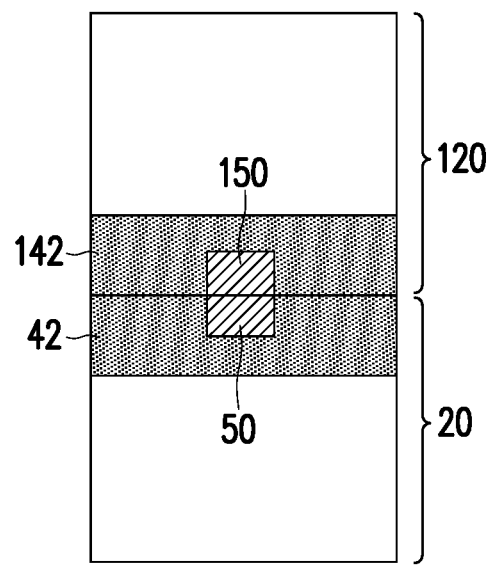

The embodiments of the present disclosure may be applied to wafer-to-wafer bonding, die-to-wafer bonding, die-to-die bonding, fusion bonding, and hybrid bonding. For example, FIG. 13 schematically illustrates a wafer-to-wafer fusion bonding scheme. FIG. 14 schematically illustrates a wafer-to-wafer hybrid bonding scheme. FIG. 15 schematically illustrates a die-to-wafer fusion bonding scheme. FIG. 16 schematically illustrates a die-to-wafer hybrid bonding scheme. FIG. 17 schematically illustrates a die-to-die fusion bonding scheme. FIG. 18 schematically illustrates a die-to-die hybrid bonding scheme.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By selecting proper combinations of the materials and the compositions of the bonded dielectric layers, the heterogeneous bonding may be performed to achieve higher bonding strength, higher yield, and lower required annealing temperatures than conventional homogeneous bonding schemes. For example, in accordance with some embodiments of the present disclosure, with the annealing temperature being as low as 200° C. (without treatment being performed), the bonding strength may achieve 2 J/m² or higher. Even at the annealing temperature being as low as 170° C., the bonding strength may still achieve 1.5 J/m² or higher. The thicknesses of the interface layer may be in the range between about 40 Å and about 400 Å. When proper combinations of compositions are selected, the thickness of the interface layer may be lower than ism A, lower than about 80 Å, or in the range between about 40 Å and about 60 Å. As a comparison, when conventional homogeneous bonding scheme is used, the bonding strength may achieve 2 J/m² or higher (for $SiO_2$ to $SiO_2$ bonding) at the cost of the high annealing temperature of 250° C., and at the cost of performing treatments using $N_2$ or $O_2$. If the treatment is not performed in the conventional homogeneous bonding scheme, the bonding strength is lower than 1.5 J/m². The interface thickness is generally between about 100 Å and about 200 Å when homogeneous bonding scheme is used.

In accordance with some embodiments of the present disclosure, a method includes putting a first package component into contact with a second package component, wherein the first package component comprises a first dielectric layer comprising a first dielectric material, wherein the first dielectric material is a silicon-oxide-based dielectric material; the second package component comprises a second dielectric layer comprising a second dielectric material different from the first dielectric material, wherein the second dielectric material comprises silicon and an element selected from the group consisting of carbon, nitrogen, and combinations thereof; and performing an annealing process to bond the first dielectric layer to the second dielectric layer. In an embodiment, before the first package component is put to contact with the second package component, no treatment process using nitrogen ($N_2$) is preformed, and no treatment process using oxygen ($O_2$) is performed. In an embodiment, the first dielectric layer has a first oxygen atomic percentage, and the second dielectric layer has a second oxygen atomic percentage, and a first difference between the first oxygen atomic percentage and the second oxygen atomic percentage is greater than about 10 percent. In an embodiment, the first dielectric layer has a first oxygen atomic percentage, and the second dielectric layer has a second oxygen atomic percentage, with the first oxygen atomic percentage being greater than the second oxygen atomic percentage by a first difference, and wherein the method further comprises, performing a treatment process on the first dielectric layer so that the first dielectric layer and the second dielectric layer have a second difference in oxygen atomic percentages, and the second difference is greater than the first difference. In an embodiment, the second dielectric layer is untreated. In an embodiment, the first dielectric layer comprises a material selected from the group consisting of silicon oxide ($SiO_2$), Fluoro Silicate glass (FSG), undoped silicate glass (USG), Phospho Silicate Glass (PSG), Boro Silicate glass (BSG), and Boro Phospho Silicate Glass (BPSG). In an embodiment, the first package component is bonded to the second package component through fusion bonding. In an embodiment, the first package component is bonded to the second package component through hybrid bonding, with the first dielectric layer being bonded to the second dielectric layer through fusion bonding, and a first metal pad in the first dielectric layer being bonded to a second metal pad in the second dielectric layer through metal-to-metal direct bonding. In an embodiment, before the first package component is put into contact with the second package component, the second package component has a third dielectric material same as the first dielectric material, and the method further comprises replacing the third dielectric material with the second dielectric material. In an embodiment, the first package component and the second package component are bonded to each other through wafer-to-wafer bonding. In an embodiment, the first package component and the second package component are bonded to each other through die-to-wafer bonding.

In accordance with some embodiments of the present disclosure, a package includes a first package component comprising a first dielectric layer comprising a first dielectric material, wherein the first dielectric material is a silicon-oxide-based dielectric material; and a second package component comprising a second dielectric layer comprising a second dielectric material different from the first dielectric material, wherein the second dielectric material comprises silicon and an element selected from the group consisting carbon, nitrogen, and combinations thereof, and wherein the first dielectric layer is bonded to the second dielectric layer. In an embodiment, the first dielectric layer and the second dielectric layer form a bonding interface layer, and wherein the bonding interface layer has a thickness smaller than 100 Å. In an embodiment, the bonding interface layer has a thickness smaller than about 60 Å. In an embodiment, the second package component further comprises a third dielectric layer overlying and contacting the second dielectric layer, wherein the third dielectric layer comprises a third dielectric material different from the second dielectric material; and a bond pad in the second dielectric layer and the third dielectric layer. In an embodiment, the first dielectric layer has a first oxygen atomic percentage, and the second dielectric layer has a second oxygen atomic percentage, and a first difference between the first oxygen atomic percentage and the second oxygen atomic percentage is greater than about 10 percent.

In accordance with some embodiments of the present disclosure, a package includes a first die comprising a first semiconductor substrate; a first integrated circuit at a surface of the first semiconductor substrate; and a first dielectric layer over the first integrated circuit, wherein the first dielectric layer comprises a first dielectric material; and a second die bonding to the first die, wherein the second die comprises a second semiconductor substrate; a second integrated circuit at a surface of the second semiconductor substrate; and a second dielectric layer underlying the second integrated circuit, wherein the first dielectric layer is physically bonded to the second dielectric layer, and wherein the second dielectric layer comprises a second dielectric material different from the first dielectric material. In an embodiment, each of the first dielectric material and the second dielectric material comprises silicon and a material selected from the group comprising oxygen, carbon, nitrogen, and combinations thereof. In an embodiment, the first dielectric layer and the second dielectric layer form an interface layer, and the interface layer has a thickness smaller than about 80 Å. In an embodiment, the package further comprises a first bond pad in the first die; and a second bond pad in the second die, wherein the first bond pad is bonded to the second bond pad through metal-to-metal direct bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
  a first package component comprising:
    a first dielectric layer comprising a first silicon-containing dielectric material; and
    a second dielectric layer over and contacting the first dielectric layer, wherein the second dielectric layer comprises a second silicon-containing dielectric material different from the first silicon-containing dielectric material; and
  a second package component over and joined to the first package component, the second package component comprising:
    a third dielectric layer comprising a third silicon-containing dielectric material same as the first silicon-containing dielectric material and different from the second silicon-containing dielectric material, wherein the third dielectric layer is joined to the second dielectric layer.

2. The structure of claim 1 further comprising:
  a first conductive feature in the first dielectric layer and the second dielectric layer; and a second conductive feature in the third dielectric layer, wherein the first conductive feature is joined to the second conductive feature.

3. The structure of claim 1 further comprising:
a metal pad under the first dielectric layer and the second dielectric layer; and
a contact plug penetrating through the first dielectric layer, the second dielectric layer, and the third dielectric layer to contact a top surface of the metal pad.

4. The structure of claim 1, wherein the first silicon-containing dielectric material and the second silicon-containing dielectric material comprise same elements selected from the group consisting of Si, O, N, C, and combinations thereof, and at least one of the same elements has a first atomic percentage in the first silicon-containing dielectric material and a second atomic percentage in the second silicon-containing dielectric material, and the first atomic percentage is different from the second atomic percentage.

5. The structure of claim 1, wherein the first silicon-containing dielectric material and the second silicon-containing dielectric material comprise same elements.

6. The structure of claim 1, wherein the second dielectric layer and the third dielectric layer form a bonding interface layer, and wherein the bonding interface layer has a thickness smaller than 100 Å.

7. The structure of claim 6, wherein the bonding interface layer has the thickness smaller than about 60 Å.

8. The structure of claim 1, wherein the second dielectric layer has a first oxygen atomic percentage, and the third dielectric layer has a second oxygen atomic percentage, and wherein a difference between the first oxygen atomic percentage and the second oxygen atomic percentage is greater than about 10 percent.

9. The structure of claim 1, wherein Si—O—Si bonds are formed to join the second dielectric layer to the third dielectric layer.

10. A structure comprising:
a first die comprising:
a first semiconductor substrate;
a first integrated circuit at a surface of the first semiconductor substrate;
a first dielectric layer over the first integrated circuit, wherein the first dielectric layer comprises a first dielectric material; and
a second dielectric layer over and contacting the first dielectric layer, wherein the second dielectric layer comprises a second dielectric material different from the first dielectric material; and
a second die over and bonding to the first die, wherein the second die comprises:
a second semiconductor substrate;
a second integrated circuit at a surface of the second semiconductor substrate;
a third dielectric layer underlying the second integrated circuit, wherein the third dielectric layer comprises a third dielectric material same as the first dielectric material; and
a fourth dielectric layer underlying the third dielectric layer and joined to the second dielectric layer, wherein the fourth dielectric layer comprises a fourth dielectric material different from the second dielectric material.

11. The structure of claim 10, wherein the first dielectric material, the second dielectric material, the third dielectric material, and the fourth dielectric material comprise silicon and a material selected from the group consisting of oxygen, carbon, nitrogen, and combinations thereof.

12. The structure of claim 10 further comprising:
a first bond pad and a first via in the first dielectric layer and the second dielectric layer; and
a second bond pad and a second via in the third dielectric layer and the fourth dielectric layer, wherein the first bond pad is joined to the second bond pad.

13. The structure of claim 10 further comprising Si—O—Si bonds to join the fourth dielectric layer to the second dielectric layer.

14. The structure of claim 10, wherein the second dielectric layer and the fourth dielectric layer comprise same elements, with at least one of the same elements has different atomic percentages in the second dielectric layer and the fourth dielectric layer.

15. The structure of claim 10, wherein a first one of the second dielectric layer and the fourth dielectric layer comprises an element different from elements in a second one of the second dielectric layer and the fourth dielectric layer.

16. The structure of claim 15, wherein the element is selected from the group consisting of oxygen, carbon, and nitrogen.

17. A structure comprising:
a first package component comprising:
a first dielectric layer comprising a first dielectric material;
a second dielectric layer over and contacting the first dielectric layer, wherein the second dielectric layer comprises a second dielectric material different from the first dielectric material; and
a first conductive feature in the first dielectric layer and the second dielectric layer;
a second package component comprising:
a third dielectric layer comprising a third silicon-containing dielectric material same as the first dielectric material and different from the second dielectric material, wherein the third dielectric layer is joined to the second dielectric layer; and
a second conductive feature in the third dielectric layer, wherein the second conductive feature is physically joined to the first conductive feature.

18. The structure of claim 17, wherein the first conductive feature comprises a first bond pad and a first via joined to the first bond pad, and the second conductive feature comprises a second bond pad and a second via joined to the first bond pad.

19. The structure of claim 17, wherein the first dielectric material and the second dielectric material comprise same elements selected from the group consisting of oxygen, carbon, and nitrogen with different atomic percentages of the same elements.

20. The structure of claim 17, wherein the first package component and the second package component comprise device dies.

* * * * *